United States Patent
Lilliott et al.

(10) Patent No.: US 8,832,172 B1
(45) Date of Patent: Sep. 9, 2014

(54) OPTIMAL FPGA BASED HADAMARD DETECTION

(75) Inventors: Neil Lilliott, Redhill (GB); Andrew David Laney, Addlestone (GB)

(73) Assignee: Xilinx, Inc., San Jose, CA (US)

( * ) Notice: Subject to any disclaimer, the term of this patent is extended or adjusted under 35 U.S.C. 154(b) by 2690 days.

(21) Appl. No.: 11/095,189

(22) Filed: Mar. 31, 2005

(51) Int. Cl.
  *G06F 7/32* (2006.01)
(52) U.S. Cl.
  USPC ............................. 708/520; 708/400; 708/490
(58) Field of Classification Search
  USPC .................................................. 708/400, 514
  See application file for complete search history.

(56) References Cited

U.S. PATENT DOCUMENTS

| | | | | |
|---|---|---|---|---|
| 3,795,864 | A * | 3/1974 | Fullton, Jr. ................ | 708/410 |
| 3,956,619 | A * | 5/1976 | Mundy et al. .............. | 708/410 |
| 4,055,756 | A * | 10/1977 | Jolivet et al. .............. | 708/400 |
| 6,311,202 | B1 * | 10/2001 | Hahm ........................ | 708/410 |

OTHER PUBLICATIONS

Lilliott, Neil et al., "RACH Preamble Detection," XAPP539 (v1.0), Nov. 9, 2004, pp. 1-23, available from Xilinx, Inc., 2100 Logic Drive, San Jose, CA 95124.

* cited by examiner

*Primary Examiner* — Michael D Yaary
(74) *Attorney, Agent, or Firm* — Thomas A. Ward; Michael T. Wallace; LeRoy D. Maunu

(57) ABSTRACT

A configuration for FPGA logic is provided to perform random access channel (RACH) preamble detection used in 3G mobile communications to identify individual rows of a Hadamard matrix using a Walsh Hadamard Transform (WHT). The configuration provides minimal add/subtract circuit blocks for the WHT by using stages, each stage containing a shift register connected to an add/subtract circuit. The shift register has outputs provided from a tap into its $n^{th}$ and n/2 elements, the outputs being connected to an add/subtract circuit, wherein n is the order of the Hadamard matrix. In a further embodiment parallel connected shift registers are used in each stage to increase operation speed.

17 Claims, 4 Drawing Sheets

OPTIMAL FPGA BASED HADAMARD DETECTION

BACKGROUND

1. Technical Field

The present invention relates to a configuration of a Field Programmable Gate Array (FPGA) to detect when rows or columns of a Hadamard matrix are received.

2. Related Art

Hadamard matrices are square matrices of 1's and −1's whose rows and columns are orthogonal. From this it follows that a Hadamard matrix, H, of size n satisfies the equation, $HH^T = nI_n$ where $I_n$ is the n×n identity matrix. Examples of Hadamard matrices of size n=4, 8 and 16 are shown in FIGS. 1-3. A necessary condition for the Hadamard matrix to exist is that n=1, 2 or a positive multiple of 4. A further condition is that a Hadamard matrix with n>2 exists only if rem(n,4)=0. In a Hadamard matrix, placing any two columns or rows side by side gives half the adjacent cells the same sign and half the other sign.

Hadamard matrices have applications in several different areas, including combinatorics, signal processing, and numerical analysis. Examples of the use of Hadamard matrices can be found relating to combinatorics in Ryser, H. J., *Combinatorial Mathematics*, John Wiley and Sons, 1963. Use of Hadamard matrices in signal processing can be found in Pratt, W. K., *Digital Signal Processing*, John Wiley and Sons, 1978. Hadamard matrices used in numerical analysis includes use in error-correction codes, in particular, the Reed-Muller error-correcting code.

A further use for Hadamard matrices is in a handshaking process for telecommunications. For instance, in a Third Generation "3G" Mobile telephone system, a mobile unit will transmit a particular row or signature in 3G terminology from a Hadamard 16 matrix that is recognized by the base station. This allows up to 16 mobile units to request servicing by the base station simultaneously. The particular row from the Hadamard matrix is transmitted a number of times to allow base station sufficient correlation gain in detecting the Hadamard matrix rows transmitted. The base station process of detecting a row or column is known as a random access channel (RACH) preamble detection.

The RACH preamble detection can be performed by correlation of rows or columns of the Hadamard matrix received with a Hadamard matrix stored in the base stations memory, or calculated by the base station. The base station can include a processor and memory to perform the correlation, or a logic device such as an FPGA that includes a number of internal logic blocks programmed to perform steps of the correlation calculation.

It is desirable to minimize the number of operation steps required to detect rows or columns of the Hadamard matrix to control the amount of processing or logic necessary for correlation in the base station. It is further desirable to minimize the number of clock cycles necessary to perform correlation to allow the base station time to respond to the mobile unit at least half way into the following access slot.

SUMMARY

According to embodiments of the present invention, a configuration of components is provided to perform RACH preamble detection to identify individual rows of a Hadamard matrix using a Walsh Hadamard Transform (WHT). The WHT is provided with minimal add/subtract circuit blocks to perform the addition and subtraction operations required to detect all rows of the Hadamard matrix.

Embodiments of the present invention provide circuitry for detection of rows or columns of a Hadamard matrix using the WHT, the circuitry including one or more stages with a shift register connected to a selectable add/subtract circuit. The shift register of length n has tap n providing one input to the add/subtract circuit, and tap n/2 providing the second input to the add/subtract circuit wherein n is the order of the Hadamard matrix being detected. A counter is connected to control loading of the shift registers, and to alternate the function of the add/subtract circuit between add and subtract. For a Hadamard matrix of order n, the number of stages required to perform the WHT is the square root of n.

In operation with n greater than 2, a n amount of data in which we are looking for a valid row(s) of the Hadamard matrix is input into a shift register of the first stage by clocking it in one bit at a time until the $n^{th}$ bit of a row is in the register. When the nth bit is shifted in, the first add operation is performed by the add/subtract block using the $n^{th}$ bit and the n/2 bit from the shift register of the first stage. The addition result is shifted into the first element of a shift register in the subsequent stage. A subtract operation is then performed in the add/subtract block of the first stage, and the result is shifted into the shift register of the second stage. Next, the bits of the shift register of the first stage are shifted once and an addition operation is performed with $n^{th}$ bit and n/2 bit from the shift register in the first stage, with the result shifted into the shift register of the second stage. A subtraction operation is then performed and the results shifted into the register of the second stage. This process continues until the second stage shift register is completely loaded with the add/subtract results of the previous stage, and then a similar set of operations occurs in the second stage while the previous stage is now free to start the load, add/subtract process on new data. The last stage output provides the n results of the WHT.

In a further embodiment, parallel connected shift registers are used in each stage to reduce the total clock cycles needed to detect multiple Hadamard rows. With parallel registers, multiplexers connect the outputs of the two parallel registers to the add/subtract block in each stage. The outputs from the multiplexer are selectively provided from one shift register to the add/subtract block, while the other parallel shift register is loaded.

By using a shift register and connected add/subtract circuit according to embodiments of the present invention, minimal logic is required to detect Hadamard codes. The implementation is ideally suited for an FPGA as it is based around simple counters and shift registers and add/subtract blocks that are typically implemented in FPGAs. For example, for a Hadamard matrix with n=16, 4 stages of 8 add/subtract blocks are used with parallel operation provided. Thus, 32 add or subtract blocks are required to detect the rows of the 16×16 matrix (256 add or subtracts would be needed otherwise). In the majority of cases, parallel performance is not required so the 8 add/subtract blocks from each stage can be combined into 4 add/subtract blocks, one in each stage. With a Hadamard order n=16, a Shift Register Look up table with 16 bits (SRL 16), a component provided in FPGAs manufactured by Xilinx, Inc. of San Jose, Calif., can easily implement the logic for the embodiments of the present invention.

BRIEF DESCRIPTION OF THE DRAWINGS

Further details of the present invention are explained with the help of the attached drawings in which:

FIGS. 1-3 shows Hadamard matrices of orders n=4, n=8 and n=16;

DETAILED DESCRIPTION

Figure 4:
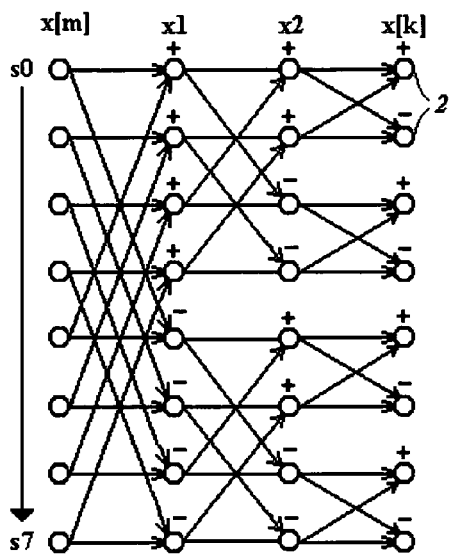
FIG. 4 illustrates implementation of a Walsh Hadamard Transform (WHT)

The diagram of FIG. 4 illustrates how addition and subtraction operations can be performed for a WHT with a Hadamard matrix of order n=8. The input to the matrix, s0-s7, is a set of input data in which a the FWT will determine the presence of each of the 8 rows of the Hadamard matrix. If two mobile units are transmitting a different row simultaneously then both mobiles can be detected since the rows of a given Hadamard matrix size n are orthogonal.

The nodes 2 of the matrix illustrate addition or subtraction operations performed by the WHT to detect one or more of the 8 rows applied as a signal s0-7, and the output x[k] provides the results of the WHT. The detection process can be understood more readily with consideration of multiple mobile units simultaneously sending out one of the rows of a Hadamard matrix. It is the job of the circuit defined by embodiments of the present invention to detect the possibility of n rows in the matrix being received simultaneously from n mobile units trying to establish communication with the base station at the same time.

Figures 1, 2, 3:
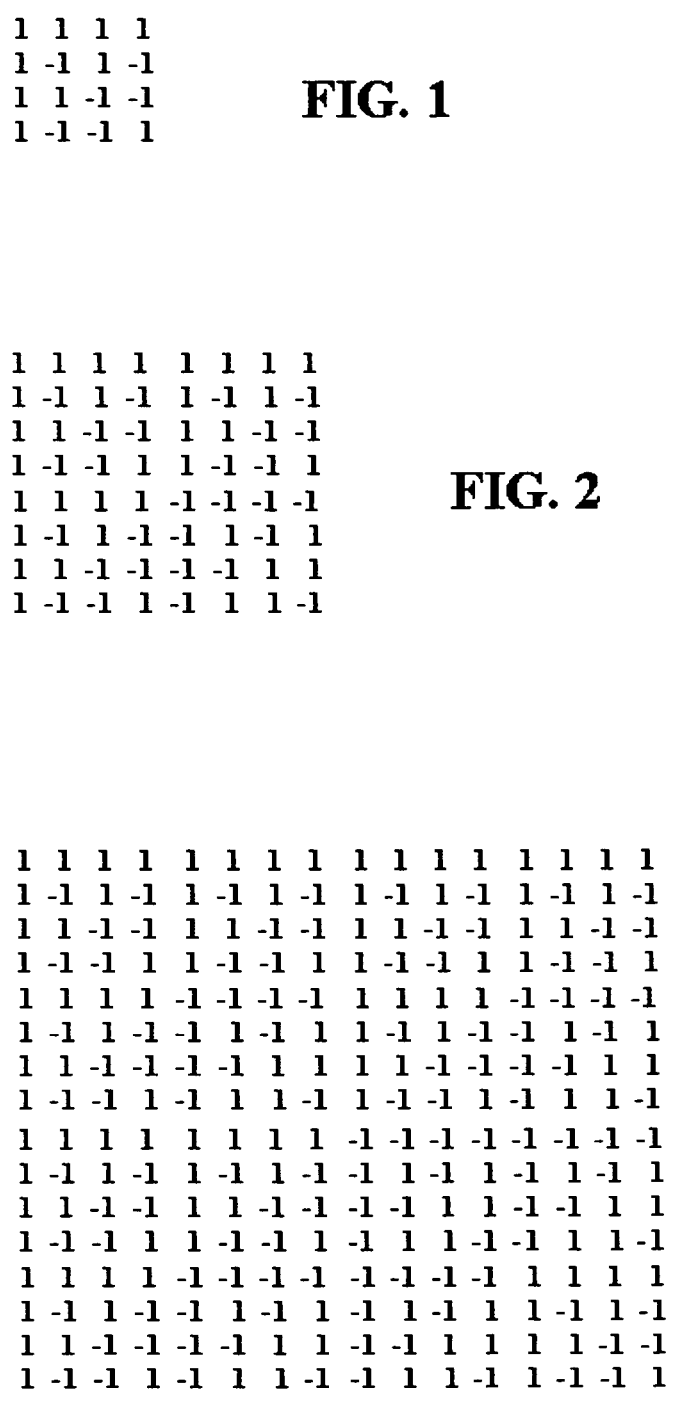

For example, if a mobile unit 1 transmits row 1 of FIG. 2 (1 −1 1 −1 1 −1 1 −1) and mobile unit 2 transmits row 4 (1 −1 −1 1 1 −1 −1 1) then the resulting input at the base station receiver is the sum of the two mobiles (2 −2 0 0 2 −2 0 0):

1 −1 1 −1 1 −1 1 −1

+1 −1 −1 1 1 −1 −1 1

=2 −2 0 0 2 −2 0 0

The WHT can serve to detect each code by functioning to multiply by the original codes. In the case of "1s" and −1s" such multiplying is the same as adding and subtracting the codes with the receive data. For example to see if (1 −1 1 −1 1 −1 1 −1) is present in the received signal (2 −2 0 0 2 0 −2 0 0), the sign bits from row 1 code are applied to the receive data as follows:

+(2)−(−2)+(0)−(0)+(2)−(−2)+(0)−(0)=8

For the second mobile unit (1 −1 −1 1 1 −1 −1 1) are applied as follows:

+(2)−(−2)−(0)+(0)+(2)−(−2)−(0)+(0)=8

For any other code not present in the data (row in the list) say row 8 that has the values (1 −1 −1 1 −1 1 1 −1) the result will be 0. For row 8 the application is as follows:

+(2)−(−2)−(0)+(0)−(2)+(−2)+(0)−(0)=0

The Hadamard rows are orthogonal in that they do not interfere with each other (i.e. all other rows not transmitted result in zero in the WHT).

The nodes 2 in the diagram of FIG. 4, thus, illustrates generally how addition and subtraction operations points can be instantiated or programmed into logic blocks of an FPGA to detect individual rows of a Hadamard matrix without requiring comparison of rows of the Hadamard matrix with rows stored in a memory. Derivation of the diagram of FIG. 4 is described to follow.

To derive FIG. 4, first an orthogonal matrix (such as a Hadamard) is used to define an orthogonal transform, creating the Walsh-Hadamard transform of order n as follows:

$$\begin{cases} \overline{X} = H\overline{x} \\ \overline{x} = H\overline{X} \end{cases}$$

These are the forward and inverse WHT pair, where:

$$x=[x(0),x(1),\ldots,x(N-1)]^T$$

and $$X=[X(0),X(1),\ldots,X(N-1)]^T$$

The $k^{th}$ element of the transform X(k) can be written as:

$$X(k) = \sum_{m=0}^{N-1} h(k,m)x(m) = \sum_{m=0}^{N-1} x(m) \prod_{i=0}^{n-1} (-1)^{m_i k_i}$$

An N=8 point WHT for a signal x(m) can then be defined as:

$$\begin{bmatrix} X(0) \\ \vdots \\ X(3) \\ X(4) \\ \vdots \\ X(7) \end{bmatrix} = \begin{bmatrix} H_2 & H_2 \\ H_3 & -H_3 \end{bmatrix} \begin{bmatrix} x(0) \\ \vdots \\ x(3) \\ x(4) \\ \vdots \\ x(7) \end{bmatrix}$$

This equation can be divided into two parts. The first half of the X vector can be obtained as:

$$\begin{bmatrix} X(0) \\ X(1) \\ X(2) \\ X(3) \end{bmatrix} = H_2 \begin{bmatrix} x(0) \\ x(1) \\ x(2) \\ x(3) \end{bmatrix} + H_3 \begin{bmatrix} x(4) \\ x(5) \\ x(6) \\ x(7) \end{bmatrix} = H_2 \begin{bmatrix} x_1(0) \\ x_1(1) \\ x_1(2) \\ x_1(3) \end{bmatrix}$$

The second half of the X vector can then be obtained as:

$$\begin{bmatrix} X(4) \\ X(5) \\ X(6) \\ X(7) \end{bmatrix} = H_2 \begin{bmatrix} x(0) \\ x(1) \\ x(2) \\ x(3) \end{bmatrix} - H_3 \begin{bmatrix} x(4) \\ x(5) \\ x(6) \\ x(7) \end{bmatrix} = H_2 \begin{bmatrix} x_1(4) \\ x_1(5) \\ x_1(6) \\ x_1(7) \end{bmatrix}$$

What has been done is a conversion of a WHT with N=8 into two WHTs with size N/2=4. Continuing this process to further reduce a WHT to a size N/4=2, the following two equation halves are obtained:

$$\begin{bmatrix} X(0) \\ X(1) \end{bmatrix} = H_1 \begin{bmatrix} x_1(0) \\ x_1(1) \end{bmatrix} + H_1 \begin{bmatrix} x_1(2) \\ x_1(3) \end{bmatrix} = H_1 \begin{bmatrix} x(0) \\ x(1) \end{bmatrix} = \begin{bmatrix} 1 & 1 \\ 1 & -1 \end{bmatrix} \begin{bmatrix} x_3(0) \\ x_2(1) \end{bmatrix}$$

and $$\begin{bmatrix} X(0) \\ X(1) \end{bmatrix} = H_1 \begin{bmatrix} x_1(0) \\ x_1(1) \end{bmatrix} - H_1 \begin{bmatrix} x_2(2) \\ x_2(3) \end{bmatrix} = H_1 \begin{bmatrix} x(2) \\ x(3) \end{bmatrix} = \begin{bmatrix} 1 & 1 \\ 1 & -1 \end{bmatrix} \begin{bmatrix} x_2(2) \\ x_2(3) \end{bmatrix}$$

Finally by breaking the equations down further the following equation halves are obtained:

$X(0)=x_2(0)+x_2(1);$ and $X(1)=x_2(0)-x_2(1).$

A complete breakdown of equations for X(0) through X(7) will generate the diagram of FIG. 4.

The diagram of FIG. 4 illustrates how the 8 samples (s0-s7) from a Hadamard 8 matrix row are presented at the input and ripple through the diagram nodes to produce a correlation to each row of the Hadamard matrix. A correlation or detection of a particular row of the Hadamard matrix will generate a particular number at one of the matrix outputs x[k] in FIG. 4 where k gives the number of the row detected, while the remaining matrix outputs x[k] will be a different number of the same lower value. For example, if a first row 1,1,1,1,1,1,1,1 of the Hadamard matrix is applied as s0-s7, the output x[k] where k=0 will be 8, while the outputs x[k] where k=1-7 will be 0. If s0-s7 is the second row 1,-1,1,-1,1,-1,1,-1 of the Hadamard matrix, the output x[k] where k=1 will be 8, while the outputs for k=1 and 3-7 will be 0.

To detect all rows simultaneously for a Hadamard 8 matrix requires 64 add/subtract blocks without using the node reduction configuration of FIG. 4, while using the Fast Hadamard Transform (FHT) the number of operations is halved to 32 FIG. 4. A Fast Hadamard Transform (FHT), such as the WHT, is a technique that can be used to simultaneously detect the presence of all rows of the Hadamard matrix on a given set of input data (S0-n) using consecutive add/subtract stages instantiated into an FPGA. For the WHT of FIG. 4 with n=8, 32 (4×8) nodes are shown that may be implemented by 32 add/subtract blocks grouped into 8 add/subtracts in each stage and associated connections between each stage in an FPGA.

Figure 5:
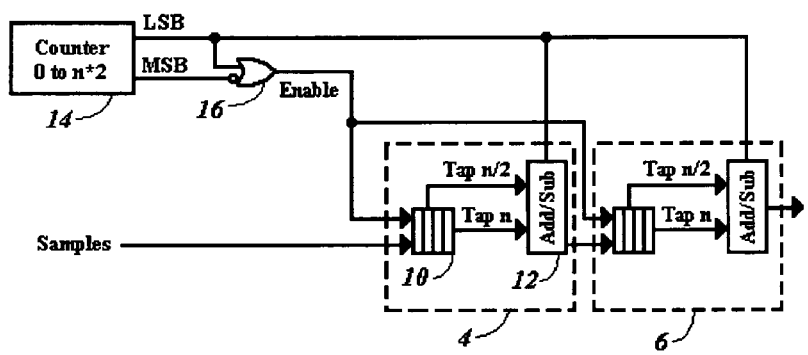
FIG. 5 shows a first and second stage for performing a WHT with a Hadamard matrix of order n=4.

FIG. 5 shows circuitry according to embodiments of the present invention for performing a WHT on a Hadamard 4 matrix with two stages, 4 and 6, each stage with a shift register 10 and a single add/subtract block 12. The embodiment illustrated by FIG. 5 significantly reduces the total number of add/subtract blocks needed for the WHT. The configuration of FIG. 5 shows components for performing a WHT for a Hadamard matrix of order n=4. For a given orthogonal matrix order n, however, a similar circuit to that shown in FIG. 5 can be used with a square root of n stages needed, and a shift register such as 10 having n bits in each stage.

In each stage, the add/subtract block 12 has a first input provided from the $n^{th}$ stage of shift register 10, and a second input is provided from a tap into the n/2 bit of the register 10, wherein n is the order of the Hadamard matrix being detected. The shift register 10 of the first stage 4 is loaded with the Hadamard matrix row. The shift register in subsequent stages, such as stage 6, is loaded with the results from the add/subtract block of the previous stage.

To provide clocking of the shift registers and add/subtract circuits, a counter 14 is provided. The counter 14 has a two bit output with a Least Significant Bit (LSB) providing a select signal to control the add or subtract function of the add/subtract blocks in each stage 4 and 6. The LSB and an inverted Most Significant Bit (MSB) are provided as inputs to a NOR gate 16. The NOR gate operates to enable clocking of the shift registers.

Figure 6:
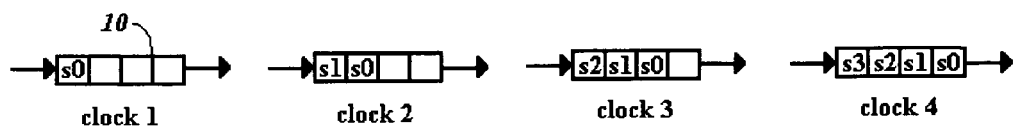
FIG. 6 illustrates data shifted into a four bit shift registers of the first stage of FIG. 5 over four clock cycles 1-4.

Operation of the circuitry of FIG. 5 is described with reference to FIGS. 6-7. Although shown for n=4, similar operation can be provided for circuits with n being greater or less than 4 as described in more detail subsequently. In operation with the circuitry of FIG. 5, a row of the Hadamard matrix (bits s0-s3) is initially input into the shift register 10. The bits are clocked into the register 10 one at a time as illustrated in FIG. 6 over four clock cycles 1-4.

Figure 7:
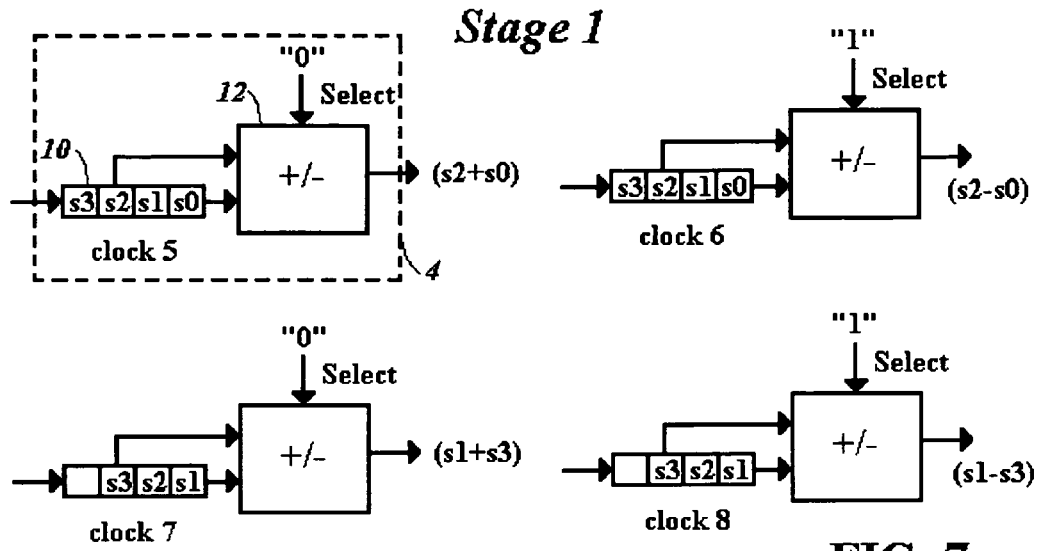
FIG. 7 shows the first stage of FIG. 5 illustrating operations in clock cycles 5-8.

As illustrated in FIG. 7, operations are performed in the first stage 4 over the next four clock cycles 5-8. During clock 5, the contents the $n^{th}$ bit (s0) of shift register 10 are added to the bit taped at the n/2 location (s2) in the add/subtract block 12 to provide the output (s0+s2) from the output of the add/subtract block 12. During clock 6, the select input of the add/subtract block 12 is changed to select subtraction, and the contents of the $n^{th}$ bit (s0) and the n/2 bit (s2) are subtracted to produce (s0−s2) from the output of add/subtract block 12. During clock 7, the contents of the shift register 10 are shifted right one bit and selection is changed back to addition before the $n^{th}$ bit s1 of the shift register 10 is added to the n/2 element s3 to produce the output (s3+s1) from the add/subtract block 12. During clock 8, the selection is changed to subtraction and the n/2 bit tap (s3) is subtracted from the $n^{th}$ element (s1) of the shift register 10 to produce (s3−s1) from the output of the add/subtract block.

Figure 8:
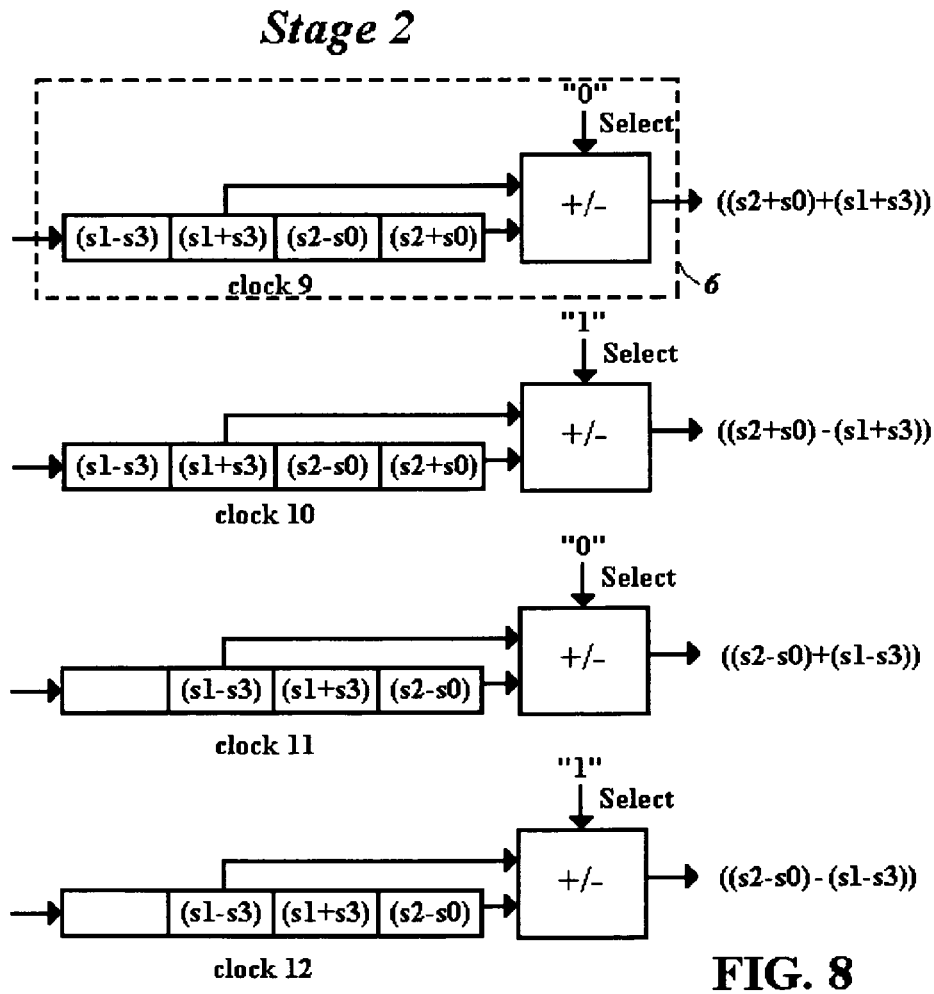
FIG. 8 shows the second stage for performing clock cycles 9-12 for the WHT.

FIG. 8 illustrates operation in the second stage 6. During clock cycle 9 it is noted that the output from the subsequent add/subtract register in clock cycles 5-8 have been shifted into the shift register of the second stage 6. In clock cycle 9, addition is selected with the $n^{th}$ shift register bit (s0+s2) added to the n/2 bit tap (s1+s3) to produce the output ((s0+s2)+(s1+s3)) from the add/subtract block, which is the first output x[k] of the WHT where k=1. In clock cycle 10, subtraction is next selected with the n/2 bit tap (s1+s3) now subtracted from the $n^{th}$ shift register location (s0+s2) to produce ((s0+s2)−(s1+s3)) from the add/subtract block, providing the second output x[k] of the WHT where k=2. In clock cycle 11, the contents of the shift register are shifted right and addition is selected, so that the $n^{th}$ shift register element (s0−s2) is added to the n/2 bit tap (s1−s3) to produce the output ((s0−s2)+(s1−s3)) from the add/subtract block, which is the first output x[k] of the WHT where k=3. In clock cycle 12, subtraction is next selected with the n/2 bit tap (s1−s3) now subtracted from the $n^{th}$ shift register element location (s0−s2) to produce ((s0−s2)−(s1−s3)) from the add/subtract block, which is the second output x[k] for a WHT where k=4.

Figure 9:
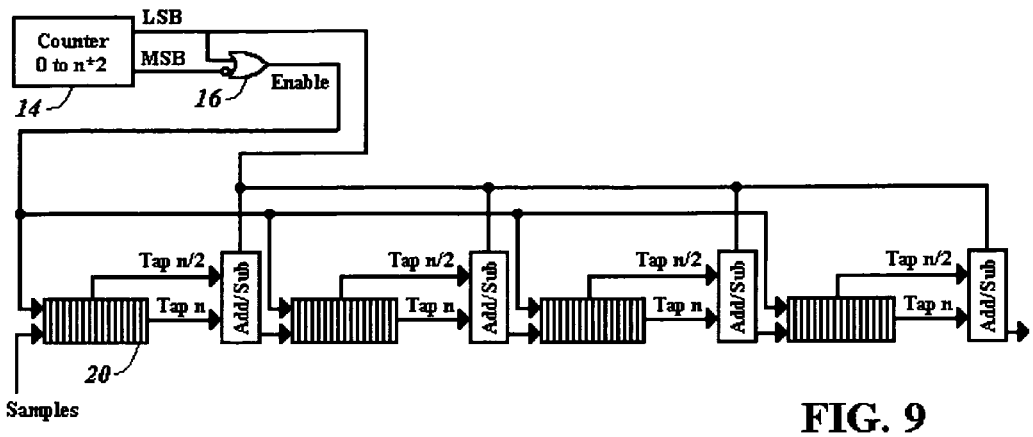
FIG. 9 shows the four stages for performing a WHT with a Hadamard of order n=16.

FIG. 9 shows the four stages and associated clocking and add/subtract selection circuitry for performing a WHT with a Hadamard of order n=16. The circuitry of FIG. 9 modifies the circuit of FIG. 5 by changing the four bit shift register 10 to a shift register 20 having 16 bits. Further, four stages are used following the rule that a square root of n states are needed to perform the WHT. Otherwise connection of the components remains the same as described with respect to FIG. 5.

Figure 10:
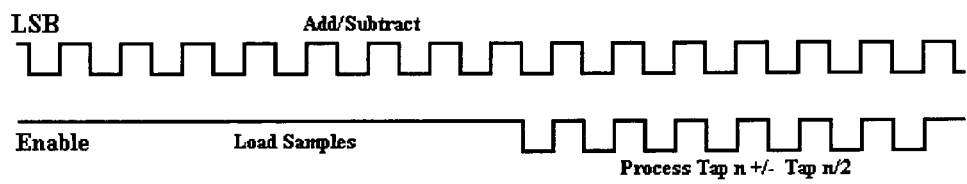
FIG. 10 is a timing diagram showing the counter and enable signals provided in the circuit of FIG. 9.

FIG. 10 is a timing diagram showing the shift register enable and add/subtract selection signals provided in the circuit of FIG. 9. As shown, the LSB from counter 14 is toggled every cycle since add and subtract operations are performed in an alternating manner. The enable signal provided from the NOR gate 16 is enabled constantly for 16 clock transitions to enable the initial loading of the shift register 20. For the next 16 clock transitions the enable signal toggles to provide for alternative addition and subtraction of numbers at the tap points of the shift register. The shift register is, thus, shifted only after both an add and a subtract are performed on the same data.

Figure 11:
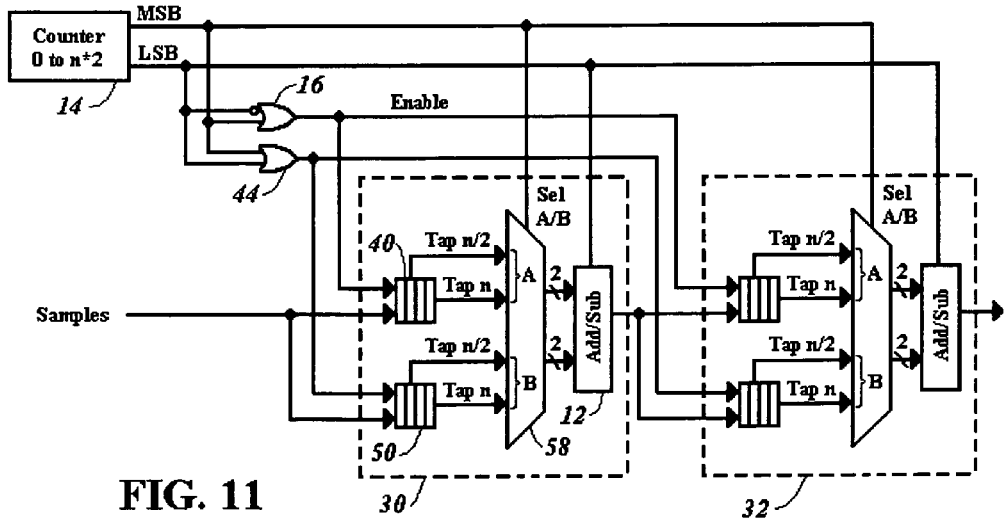
FIG. 11 shows two stages for performing a WHT for a Hadamard of order n=4, each stage having parallel shift registers to perform parallel processing.

FIG. 11 shows two stages for performing a WHT for a Hadamard of order n=4, each stage having parallel shift registers and adders to perform parallel processing. Parallel processing reduces the wasted clock cycle overhead during the initial loading, since one add/subtract block can be processing while a parallel shift register is loading. FIG. 11 illustrates how circuits are so connected in parallel, in each of two stages 30 and 32. Each of the stages 30 and 32 contain two shift registers 40 and 50. Outputs of the shifters 40 and 50 are provided through a multiplexer 58 to provide two inputs to the add/subtract block 12.

A multiplexer select signal is chosen so outputs from one of the shift registers 40 and 50 is provided for adding or subtracting, while the other shift register is loaded. The multiplexer select signal is provided by the MSB from counter 14. An additional NOR gate 44 is provided with inputs receiving the MSB and LSB outputs from the counter 14, the NOR gate 44 providing an enable signal to the second shift register 50, while the NOR gate 16 configured as in FIG. 5 enables the first shift register 40.

If less clock cycles are desirable, or FPGA resources are not available to create all the structure of FIG. 11, a partially parallel approach can be used. In a partially parallel approach, parallel registers and add/subtract blocks are only included in some stages. Such a configuration may be desirable when Hadamard matrices of order 16 are used and SRL16s, described previously, are not available. If resources are limited and a full parallel approach is desired, a triple port RAM memory device might be used having one write port and two read ports to function as the parallel registers.

Although embodiments of the present invention are described with use to detect rows of a Hadamard matrix, it is contemplated that other orthogonal matrixes can likewise be detected. The function of embodiments of the present invention handles Hadamard matrices of order n where the square root of n is a whole number and n, n/12 or n/20 is a power of 2. Components from the embodiments can be minimized or extended such that the performance required can be balanced with efficient design to achieve the best silicon cost.

While the term row used herein applies to some embodiments. As the columns of a Hadamard matrix, as described herein, are also orthogonal, in another embodiment the invention is also applicable to columns of the Hadamard matrix. Thus the terms "row or rows" as used herein includes the rows of the Hadamard matrix or the columns of the Hadamard matrix.

Although the present invention has been described above with particularity, this was merely to teach one of ordinary skill in the art how to make and use the invention. Many additional modifications will fall within the scope of the invention, as that scope is defined by the following claims.

What is claimed is:

1. An apparatus for detecting rows or columns of a Hadamard matrix, the apparatus having at least one stage comprising:
   a shift register for storing inbound data representative of the rows or columns of the Hadamard matrix; and
   an add/subtract circuit to selectively add or subtract inputs, the add/subtract circuit having a first input provided from an $n^{th}$ element of the shift register, and a second input provided from the n/2 element of the shift register, wherein n is the number of rows or columns of the Hadamard matrix;
   wherein the add/subtract circuit is controlled to alternate in successive clock cycles, between adding data at the first input to data at the second input, and subtracting data at the second input from data at the first input.

2. The apparatus of claim 1 comprising a plurality of stages connected in series,
   wherein an input of the shift register of the first stage is connected to receive the data to perform the detection process on,
   wherein an output of the add/subtract circuit of all of the stages but a last one of the stages is connected to provide output of the add/subtract circuit as an input of the shift register in a subsequent one of the stages, and
   wherein an output of the add/subtract circuit of the last stage provides a result of a Walsh Hadamard transform.

3. The apparatus of claim 2, further comprising:
   a counter circuit having a two bit output, including a Least Significant Bit (LSB) and a Most Significant Bit (MSB) wherein the LSB is connected to a select input of the add/subtract circuit in the stages; and
   a gate having inputs connected to receive the LSB and MSB outputs from the counter circuit, and an output provided to control clocking of the shift registers of the stages.

4. The apparatus of claim 3, wherein the gate comprises a NOR gate having a first input connected to receive the LSB and a second input connected to receive the inverse of the MSB.

5. The apparatus of claim 3, wherein the number of stages is the square root of n.

6. The apparatus of claim 3, wherein each stage further comprises:
   a parallel shift register for storing additional inbound data;
   a multiplexer having a first input connected to an output of the shift register, a second input connected to an output of the parallel shift register, and an output selectively providing the $n^{th}$ and the n/2 element from one of the shift register and the parallel shift register to inputs of the add/subtract circuit.

7. The apparatus of claim 6, wherein the MSB of the counter is connected to the select input of the multiplexer.

8. The apparatus of claim 7, further comprising:
   a second gate having inputs connected to receive the LSB and MSB outputs from the counter circuit, and an output provided to control clocking of the second shift registers of the stages.

9. The apparatus of claim 1, wherein the shift register is controlled to shift data every other clock cycle.

10. An apparatus for detecting all rows or columns of an orthogonal matrix, the apparatus having at least one stage comprising:
    a means of comparing input data to each row or column of the orthogonal matrix by selectively adding and subtracting inputs, the means for comparing receiving a first input provided from an $n^{th}$ element of the input data, and a second input receiving an n/2 element of the input data, wherein n is the number of rows or columns of the orthogonal matrix;
    wherein the selectively adding and subtracting inputs alternates in successive clock cycles, between adding data at the first input to data at the second input, and subtracting data at the second input from data at the first input;

a counter circuit having a two bit output, including a Least Significant Bit (LSB) and a Most Significant Bit (MSB); and a gate having inputs connected to receive the LSB and MSB outputs from the counter circuit, and an output provided to control clocking of the means for comparing.

11. A method for identifying a series of bits from an orthogonal matrix by performing a Walsh Hadamard Transform, the method comprising:

shifting receive data bits into shift register stages;

selectively adding and subtracting from two of the tap points of each of the shift registers;

wherein the selectively adding and subtracting alternates in successive clock cycles, between adding data at the first input to data at the second input, and subtracting data at the second input from data at the first input; and wherein the orthogonal matrix has an order n, and the step of adding and subtracting occurs after n bits are loaded into the shift register.

12. The method of claim 11, further comprising:

feeding results from one of the stages into following stages of the shift registers as needed until a final output provides a correlation value of each row of the matrix present in the receive data.

13. The method of claim 11, wherein after the n bits are loaded into the register, the step of selectively adding and subtracting comprises first an addition operation and then a subtraction operation before the bits in the register are shifted again.

14. The method of claim 13 further comprising:

shifting results from the step of selectively adding and subtracting into stages of a second register; and selectively adding and subtracting from two of the stages of the second register.

15. The method of claim 14, wherein the circuit components that can selectively perform addition or subtraction subtract a first bit from a row of the matrix loaded into the shift register, and a second bit provided from the n/2 bit from the row loaded into the shift register.

16. The apparatus of claim 10, further comprising:

a shift register for storing inbound data representative of the rows or columns of the matrix; and wherein the first input for receiving the $n^{th}$ element of the input data is coupled to an $n^{th}$ tap of the shift register, and the second input for receiving the n/2 element of the input data is coupled to an n/2 tap of the shift register.

17. The method of claim 11, wherein the shifting shifts data bits between stages every other clock cycle.

* * * * *